(12) United States Patent
Hsu

(10) Patent No.: US 8,242,526 B2
(45) Date of Patent: Aug. 14, 2012

(54) LIGHT-EMITTING SEMICONDUCTOR DEVICE AND PACKAGE THEREOF

(75) Inventor: Chia-Liang Hsu, Hsinchu (TW)

(73) Assignee: Epistar Corporation, Hsinchu (TW)

( * ) Notice: Subject to any disclaimer, the term of this patent is extended or adjusted under 35 U.S.C. 154(b) by 243 days.

(21) Appl. No.: 12/550,089

(22) Filed: Aug. 28, 2009

(65) Prior Publication Data
US 2010/0051996 A1    Mar. 4, 2010

(30) Foreign Application Priority Data
Aug. 29, 2008   (TW) ................ 97133520 A

(51) Int. Cl.
*H01L 33/00*    (2010.01)

(52) U.S. Cl. .................. 257/98; 257/E33.067

(58) Field of Classification Search ............ 257/98, 257/E33.06, E33.061, E33.067, E33.068
See application file for complete search history.

(56) References Cited

U.S. PATENT DOCUMENTS

| 7,196,354 B1 * | 3/2007 | Erchak et al. | 257/79 |
| 7,812,360 B2 * | 10/2010 | Yano | 257/98 |
| 2009/0014744 A1 * | 1/2009 | Hsieh et al. | 257/98 |

FOREIGN PATENT DOCUMENTS

| CN | 1218996 | 6/1999 |
| JP | 200743074 | 2/2007 |
| TW | 200643340 | 12/2006 |
| TW | 200746473 | 12/2007 |
| TW | 200802938 | 1/2008 |

* cited by examiner

*Primary Examiner* — Zandra Smith
*Assistant Examiner* — Paul Patton
(74) *Attorney, Agent, or Firm* — Muncy, Geissler, Olds & Lowe, PLLC

(57) ABSTRACT

The present application discloses a light-emitting semiconductor device including a semiconductor light-emitting element, a transparent paste layer and a wavelength conversion structure. A first light emitted from the semiconductor light-emitting element enters the wavelength conversion structure to generate a second light which has a wavelength different from that of the first light. In addition, the present application also provides a light-emitting semiconductor device package.

20 Claims, 13 Drawing Sheets

LIGHT-EMITTING SEMICONDUCTOR DEVICE AND PACKAGE THEREOF

CROSS REFERENCE TO RELATED APPLICATIONS

This application claims the right of priority based on Taiwan Patent Application No. 097133520 entitled "A Light-emitting Semiconductor Device and Package Thereof", filed on Aug. 29, 2008, which is incorporated herein by reference and assigned to the assignee herein.

TECHNICAL FIELD

The present application relates to a light-emitting semiconductor device and package structure, and more particularly to a light-emitting semiconductor device and package thereof with a wavelength conversion structure and a transparent paste layer.

BACKGROUND

Light-emitting diode is a semiconductor solid state device, including at least one p-n junction which is sandwiched between a p-type semiconductor layer and an n-type semiconductor layer. When a bias voltage is applied on the p-n junction, the holes from the p-type semiconductor layer and the electrons from the n-type semiconductor layer are combined to generate light. The region for generating light are generally called the active region.

The major characteristics of the light-emitting diodes are small size, high luminous efficiency, long life-time, quick response, high reliability, and good color rendering index. It has wide application, for example: in electronic equipment, automobile, signboard, or traffic lighting. Because the full-colors LEDs are presented to the public, LED has been replacing gradually the fluorescence lamp and the incandescent bulb along with other traditional illumination equipments.

Generally, the light-emitting diode collocates with the material of the wavelength conversion (example: phosphor) to generate the white light. The material of the wavelength conversion can excite the yellow light, green light, or red light when it is irradiated by the blue light emitted form the LED chip, and the blue light and the yellow light, or green light and red light are mixed to generate the white light. To assure the light generated from the LED chip can pass through the material of the wavelength conversion and mix to generate the light that desired, the material of the wavelength conversion has to cover the light emitting region from the LED chip completely. However, the light emitting direction is not specific, if the material of the wavelength conversion does not cover where the light emits from the LED chip completely and results in that partial light does not pass through the material of the wavelength conversion, such as the edge light, the wavelength conversion efficiency of the light is decreased. On the other hand, if the material of the wavelength conversion covers the LED chip completely, the wavelength conversion efficiency is enhanced, but it causes the heat dissipation problem.

It is not easy to spread the material of the wavelength conversion uniformly on the LED chip. When the thickness of the material of the wavelength conversion that covers the LED chip is not uniform, the thicker portion of the material of the wavelength conversion absorbs more light than the thinner portion of material of the wavelength conversion. The excited light is then different when the lights emitted to different directions facing different thickness of the material of the wavelength conversion.

SUMMARY

The present application provides a semiconductor luminescence device including an electrically conductive substrate, a semiconductor luminescence stack layer, a transparent paste layer, and a wavelength conversion structure. A first light generated from the semiconductor luminescence stack layer passes through the transparent paste layer and is converted to a second light that has a color different form that of the first light by the wavelength conversion structure. Furthermore, at least one reflective layer is disposed between the electrically conductive substrate and the semiconductor luminescence stack layer.

The present application provides a semiconductor luminescence device including an electrically conductive substrate, a semiconductor luminescence stack layer, a transparent paste layer, and wavelength conversion materials distributed uniformly in the transparent paste layer. A first light generated from the semiconductor luminescence stack layer is converted to a second light that has a color different form that of the first light by the wavelength conversion materials. Furthermore, it further includes at least one reflective layer disposed between the electrically conductive substrate and the semiconductor luminescence stack layer.

The present application provides a semiconductor luminescence device including an electrically conductive substrate, a semiconductor luminescence stack layer, a transparent paste layer, and a wavelength conversion structure in the transparent paste layer. A first light generated from the semiconductor luminescence stack layer is converted to a second light that has a color different form that of the first light by the wavelength conversion structure. Furthermore, it further includes at least one reflective layer disposed between the electrically conductive substrate and the semiconductor luminescence stack layer.

The present application provides a semiconductor luminescence device package structure including a semiconductor luminescence device, a cup, a lead frame, a transparent paste layer, and a wavelength conversion structure. The semiconductor luminescence device is located in the cup, and the transparent paste layer is filled in the cup so the height of the transparent paste layer is at least greater than that of the semiconductor luminescence device. The wavelength conversion structure is then located on the transparent paste layer. In addition, it further includes at least one wavelength selection film between the transparent paste layer and the wavelength conversion structure. Finally, the electrical connection is formed between the semiconductor luminescence device and the lead frame.

BRIEF DESCRIPTION OF THE DRAWINGS

The foregoing aspects and many of the attendant advantages of this application will become more readily appreciated as the same becomes better understood by reference to the following detailed description, when taken in conjunction with the accompanying drawings, wherein.

DETAILED DESCRIPTION OF THE PREFERRED EMBODIMENTS

Figure 1:
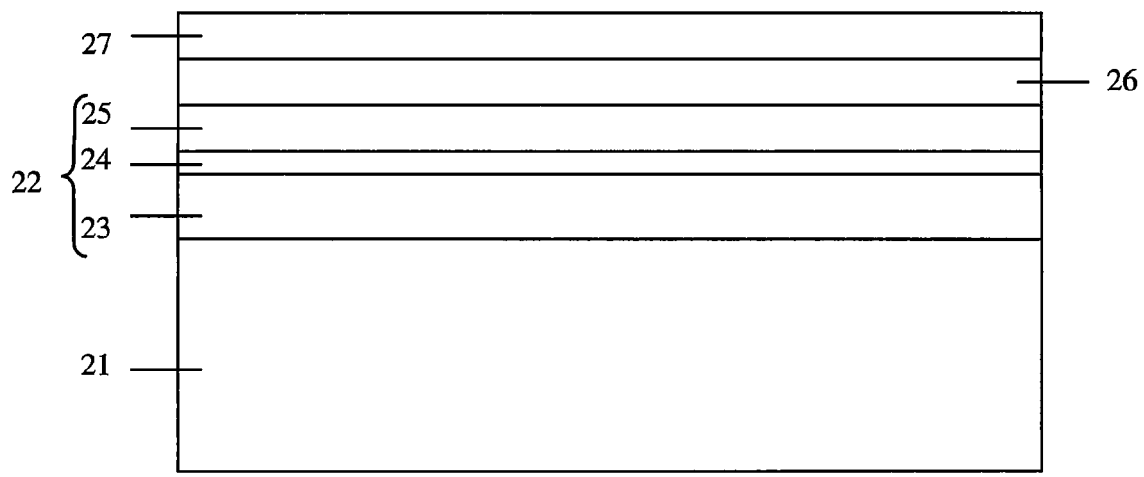
FIGS. 1-5 illustrate the sectional views of forming a semiconductor luminescence device 100 in accordance with one embodiment of the present application.
Figure 3:
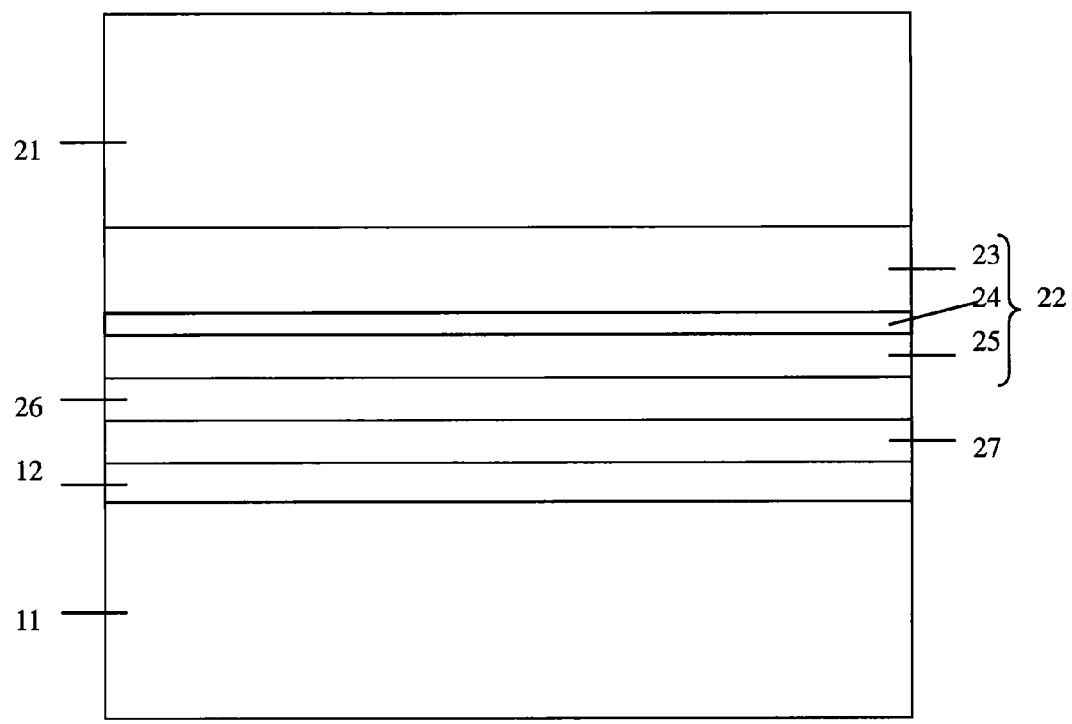
Figure 4:
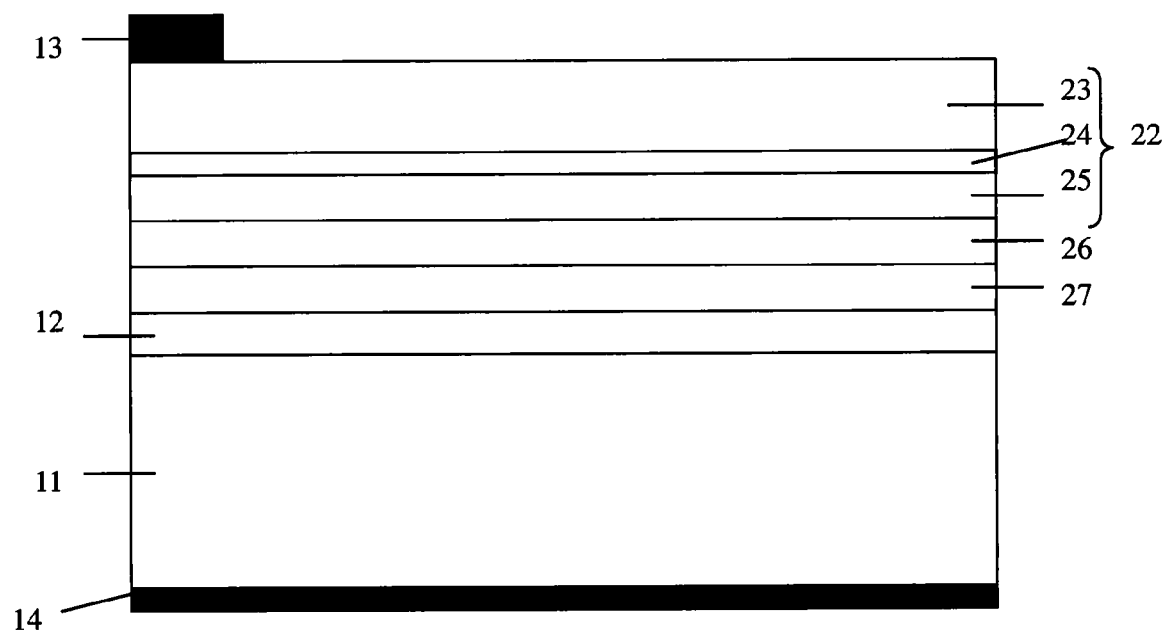
Figure 5:
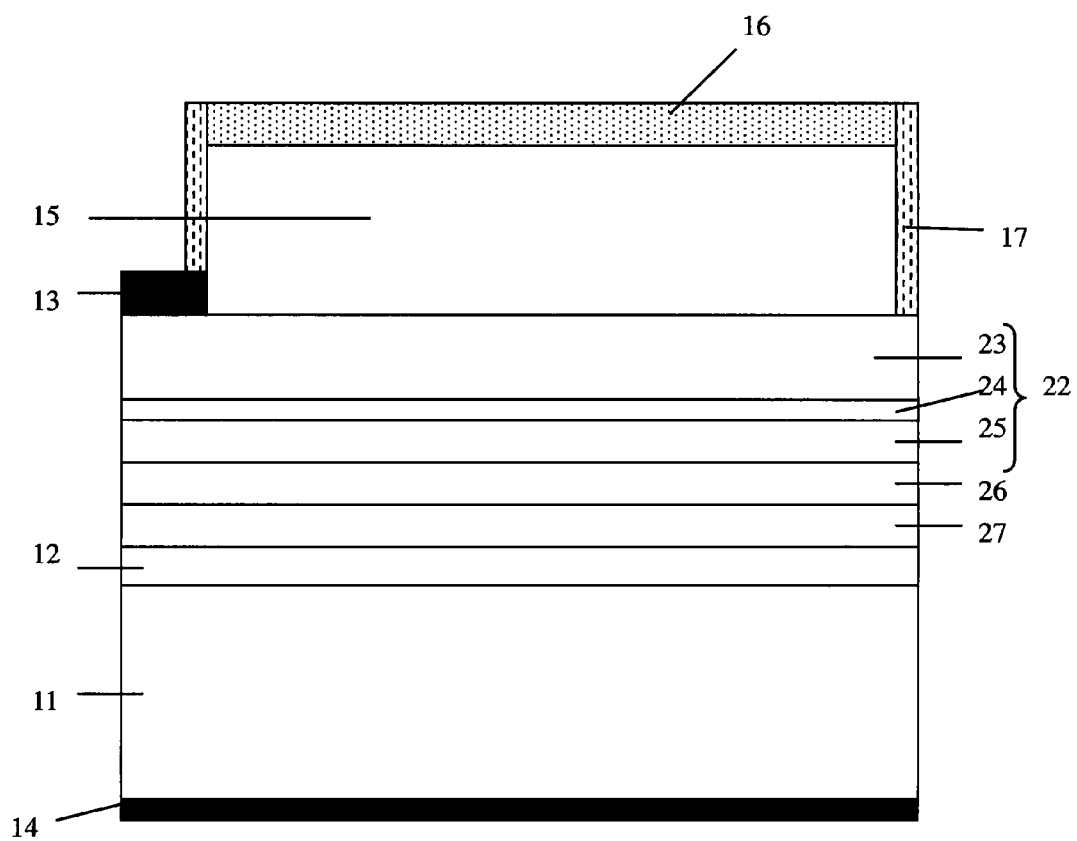

FIG. 5 illustrates the sectional view of a semiconductor luminescence device 100, and the manufacturing process is illustrated in FIG. 1 to FIG. 5. Referring to FIG. 1, a light-emitting diode for example includes a growth substrate 21, and the material of the growth substrate can be GaAs, Si, SiC, Sapphire, InP, GaIn, AlN, or GaN. Then, forming an epitaxial structure 22 on the growth substrate 21. The epitaxial structure 22 is formed by epitaxy process like MOCVD, LPE, or MBE. The epitaxial structures 22 includes at least a first conductivity type semiconductor layer 23, and the material of the first conductivity type semiconductor layer can be an n-type $(Al_xGa_{1-x})In_{1-y}P$ or an n-type $(Al_xGa_{1-x})_yIn_{1-y}N$; an active layer 24, and the material of the active layer can be $(Al_xGa_{1-x})_yIn_{1-y}P$ or $(Al_xGa_{1-x})In_{1-y}N$ to form a multiple quantum well structure; and a second conductivity type semiconductor layer 25, and the material of the second conductivity type semiconductor layer can be a p-type $(Al_xGa_{1-x})_yIn_{1-y}P$ or a p-type $(Al_xGa_{1-x})_yIn_{1-y}N$. In addition, the active layer in this embodiment can be stacked to form a structure like homostructure, single heterostructure, double heterostructure, or single quantum well.

Then, a second conductivity type contact layer 26 and a reflective layer 27 are formed on the epitaxial structure 22. The material of the second conductivity type contact layer 26 can be indium tin oxide, indium oxide, tin oxide, cadmium tin oxide, zinc oxide, magnesium oxide, or titanium nitride conductive oxide materials. The material of the reflective layer 27 can be metal such as aluminum, gold, platinum, zinc, silver, nickel, germanium, or tin, or can be made of metal and oxide, such as ITO/Ag, ITO/AlO$_x$/Ag, ITO/TiO$_x$/SiO$_x$, TiO$_x$/SiO$_x$/Al, ITO/SiN$_x$/Al, ITO/SiN$_x$/Ag, ITO/SiN$_x$/Al$_2$O$_3$Al, or ITO/SiN$_x$/Al$_2$O$_3$/Ag.

Figure 2:
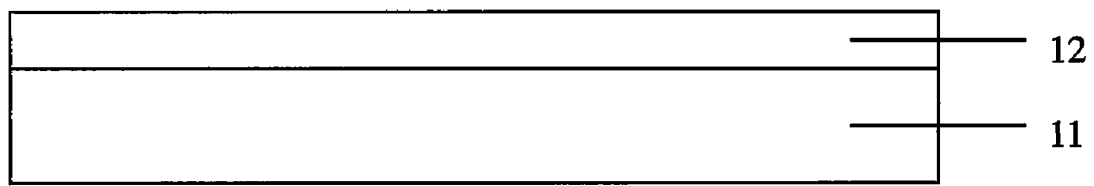

Referring to FIG. 2, a connecting layer 12 is formed on the electrically conductive substrate 11. Next, the epitaxial structure 22 with the reflective layer 27 shown in FIG. 1 is attached to the connecting layer 12 shown in FIG. 2, and the growth substrate 21 is removed (not shown) as shown in FIG. 3. The material of the connecting layer 12 can be metal, for example, AuSn, InAg, InAu, In, Au, Al, Ag, or the alloys thereof.

The electrodes 13 and 14 are formed respectively on the first conductivity type semiconductor layer 23 and under the electrically conductive substrate 11 as shown in FIG. 4. A transparent paste layer 15 with a thickness no less than 0.3 mm covers the first conductivity type semiconductor layer 23 except the portion of the upper electrode. The material of the transparent paste layer can be epoxy, and the coating area of the transparent paste layer is not greater than that of the epitaxial structure. A reflective wall 17 is formed on the sidewall of the transparent paste layer, and a wavelength conversion structure 16 covers the whole upper surface of the transparent paste layer, wherein the wavelength conversion structure 16 is made of at least one wavelength conversion material. The semiconductor luminescence device 100 shown in FIG. 5 is then formed accordingly.

The epitaxial structure 22 can emit a first light when the current is injected. The light extraction efficiency is not decreased much after the first light passes through the transparent paste layer 15 because the optical transmission of the transparent paste layer is close to 99-100% and the light from the sidewall is reflected by the reflective wall 17. The first light entering the wavelength conversion structure 16 can be absorbed by the wavelength conversion material in the wavelength conversion structure and generate a second light having a wavelength different from that of the first light. Because the wavelength conversion material is not limited to one kind, the second light can be many colors.

In this embodiment, the wavelength conversion material is phosphor, for example, $Y_3Al_5O_{12}$. Besides, the wavelength conversion material can also be $Gd_3Ga_5O_{12}$:Ce, $(Lu,Y)_3Al_5O_{12}$:Ce, SrS:Eu, $SrGa_2S_4$:Eu, $(Sr,Ca,Ba)(Al,Ga)_2S_4$:Eu, (Ca,Sr)S:Eu,Mn, (Ca,Sr)S:Ce, $(Sr,Ba,Ca)_2Si_5N_8$:Eu, $(Ba,Sr,Ca)_2SiO_4$:Eu, $(Ca,Sr,Ba)Si_2O_2N_2$:Eu, and an non-electrically-insulative material like CdZnSe is preferred.

Figure 6:
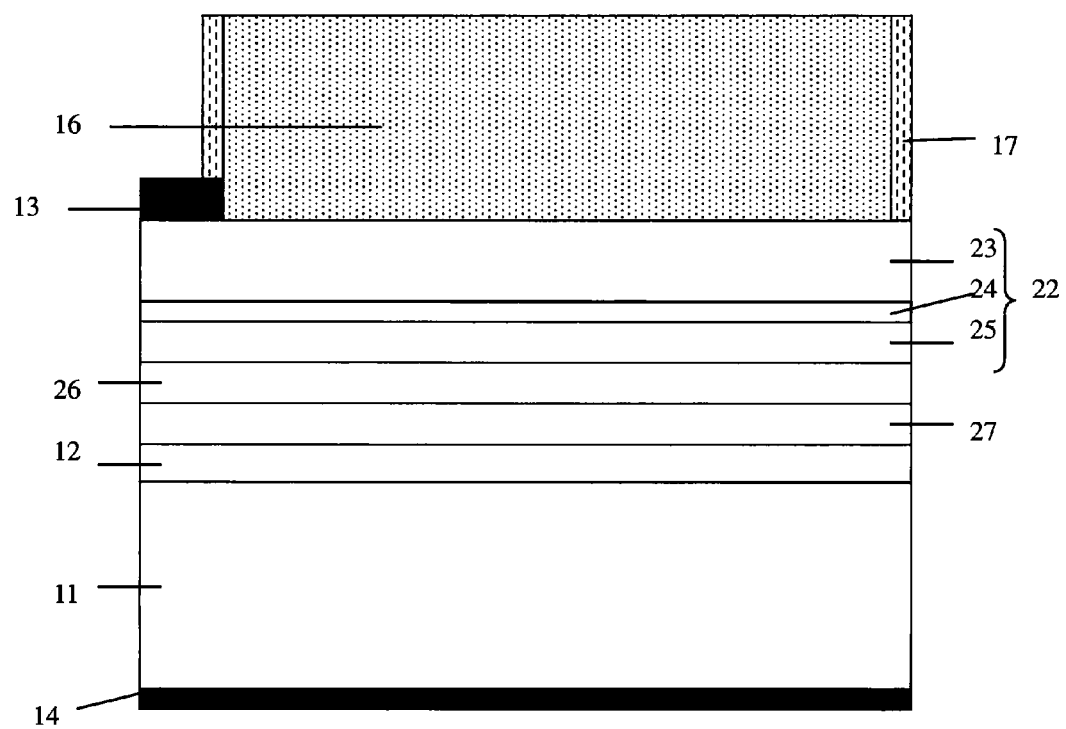
FIG. 6 illustrates a sectional view of forming a semiconductor luminescence device 200 in accordance with another embodiment of the present application.

FIG. 6 illustrates a sectional view of forming a semiconductor luminescence device 200 in accordance with another embodiment of the present application. The preceding manufacturing processes are the same as that of the above embodiment shown in FIG. 1 to FIG. 4. A transparent paste layer 15 with a thickness no less than 0.3 mm covers the first conductivity type semiconductor layer 23 except the portion of the upper electrode, and the transparent paste layer contains wavelength conversion material distributed uniformly therein. The material of the transparent paste layer can be epoxy, and the coating area of the transparent paste layer is not greater than that of the epitaxial structure. A reflective wall 17 is formed on the sidewall of the transparent paste layer. The semiconductor luminescence device 200 shown in FIG. 6 is then formed accordingly. The epitaxial structure 22 can emit a first light when the current is injected. The first light entering the wavelength conversion structure can be absorbed by the wavelength conversion material in the wavelength conversion structure, and generate a second light which is different from that of the first light. Because the wavelength conversion material is not limited to one kind, the second light can be many colors.

Figure 7:
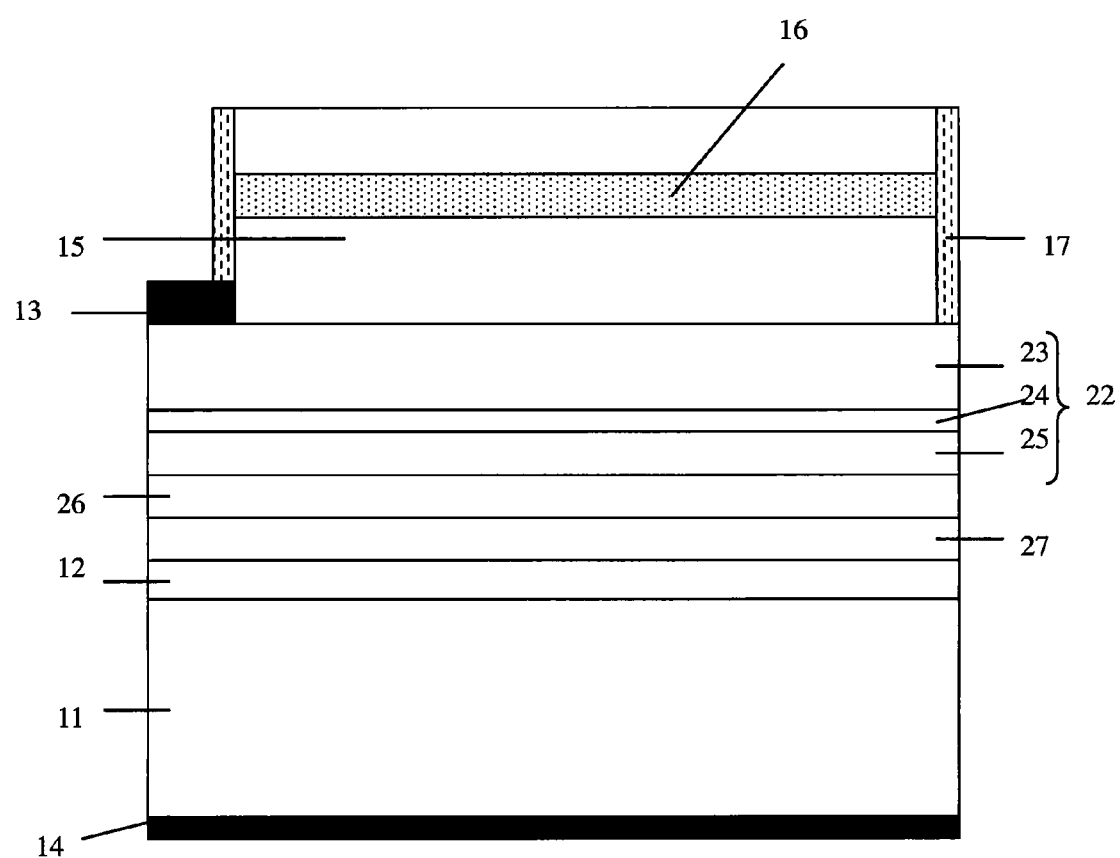
FIG. 7 illustrates a sectional view of forming a semiconductor luminescence device 300 in accordance with another embodiment of the present application.

FIG. 7 illustrates a sectional view of forming a semiconductor luminescence device 300 in accordance with another embodiment of the present application. The preceding manufacturing processes are the same as that of the above embodiment, as the FIG. 1 to FIG. 4 shown. A transparent paste layer 15 with a thickness no less than 0.3 mm covers the first conductivity type semiconductor layer 23 except the portion of the upper electrode. The material of the transparent paste layer can be epoxy, and the coating area of the transparent paste layer is not greater than that of the epitaxial structure. A reflective wall 17 is formed on the sidewall of the transparent paste layer 15, and a wavelength conversion structure 16 is formed in the transparent paste layer 15, wherein the wavelength conversion structure 16 contains at least one kind of wavelength conversion material. The semiconductor luminescence device 300 shown in FIG. 7 is then formed accordingly. The epitaxial structure 22 can emit a first light when the current is injected. The light extraction efficiency is not decreased much after the first light passes through the transparent paste layer 15 because the optical transmission of the transparent paste layer is close to 99-100% and the light from the sidewall is reflected by the reflective wall 17. The first light entering the wavelength conversion structure 16 can be absorbed by the wavelength conversion material in the wavelength conversion structure and generate a second light having a wavelength different from that of the first light. Because the wavelength conversion material is not limited to one kind, the second light can be many colors. Finally, the light emits through the transparent paste layer.

Figure 8A:
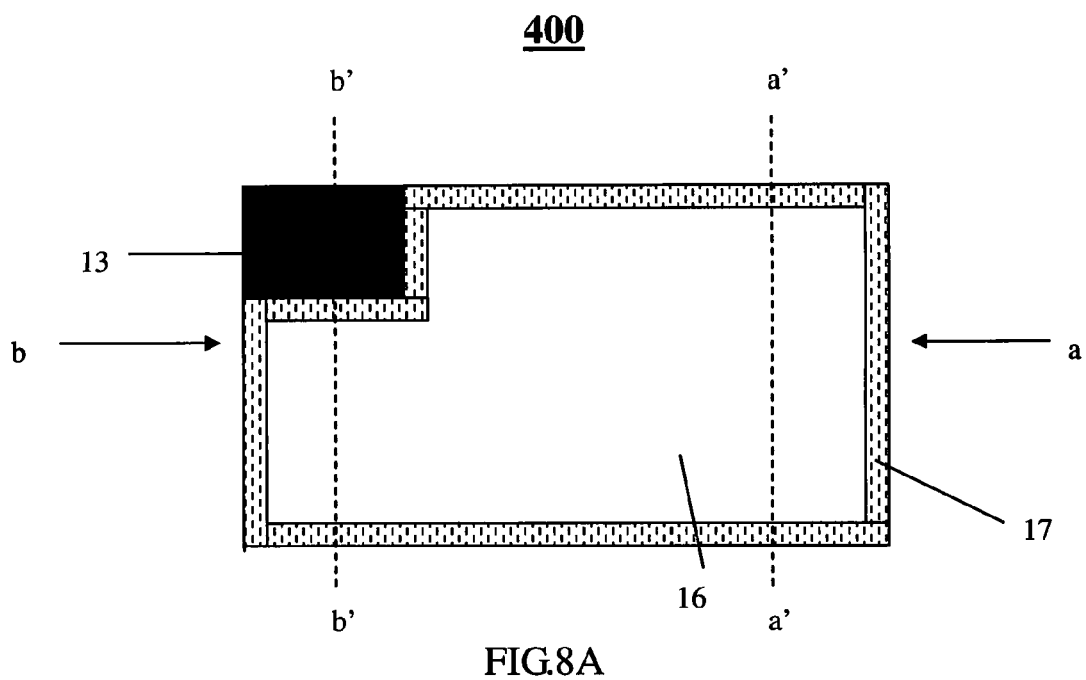
FIGS. 8A-8C illustrate the sectional views of forming a semiconductor luminescence device 400 in accordance with another embodiment of the present application.
Figure 8B:
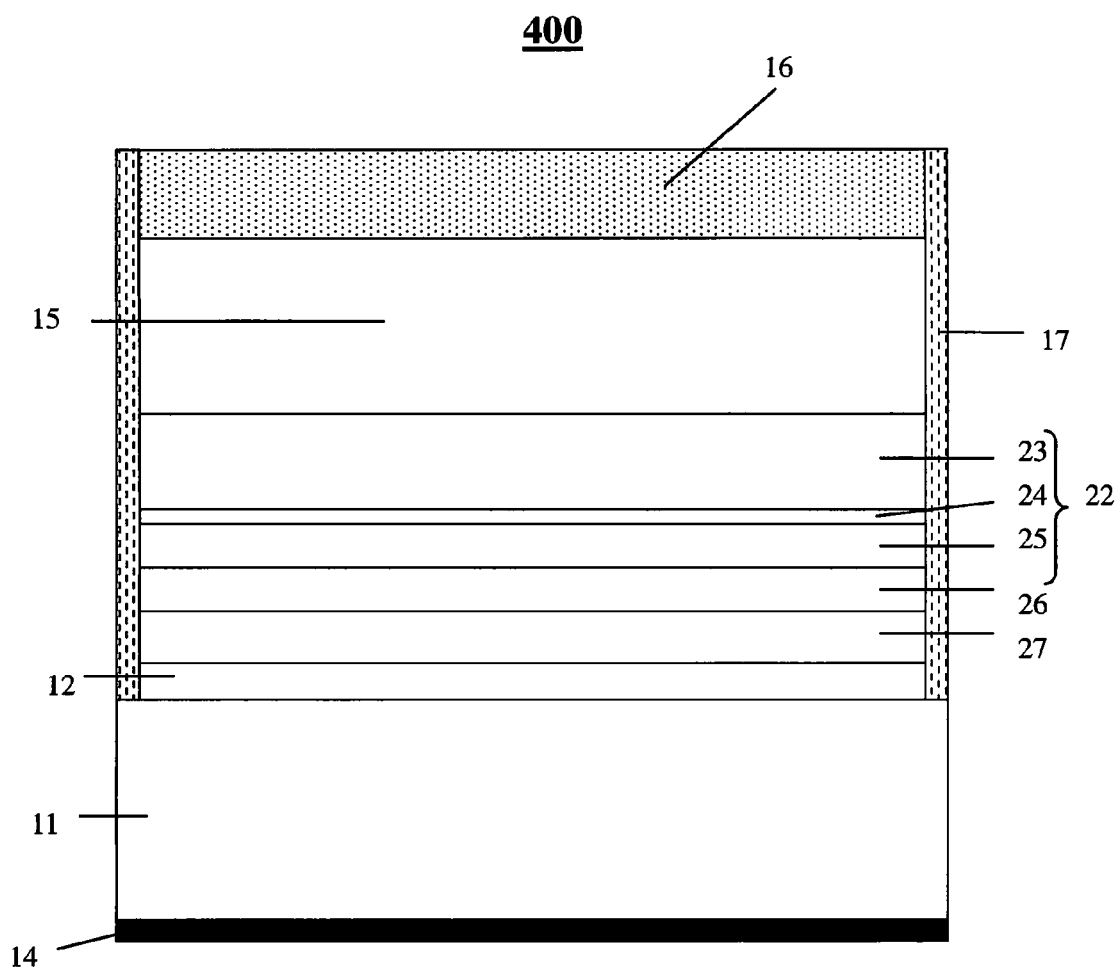
Figure 8C:
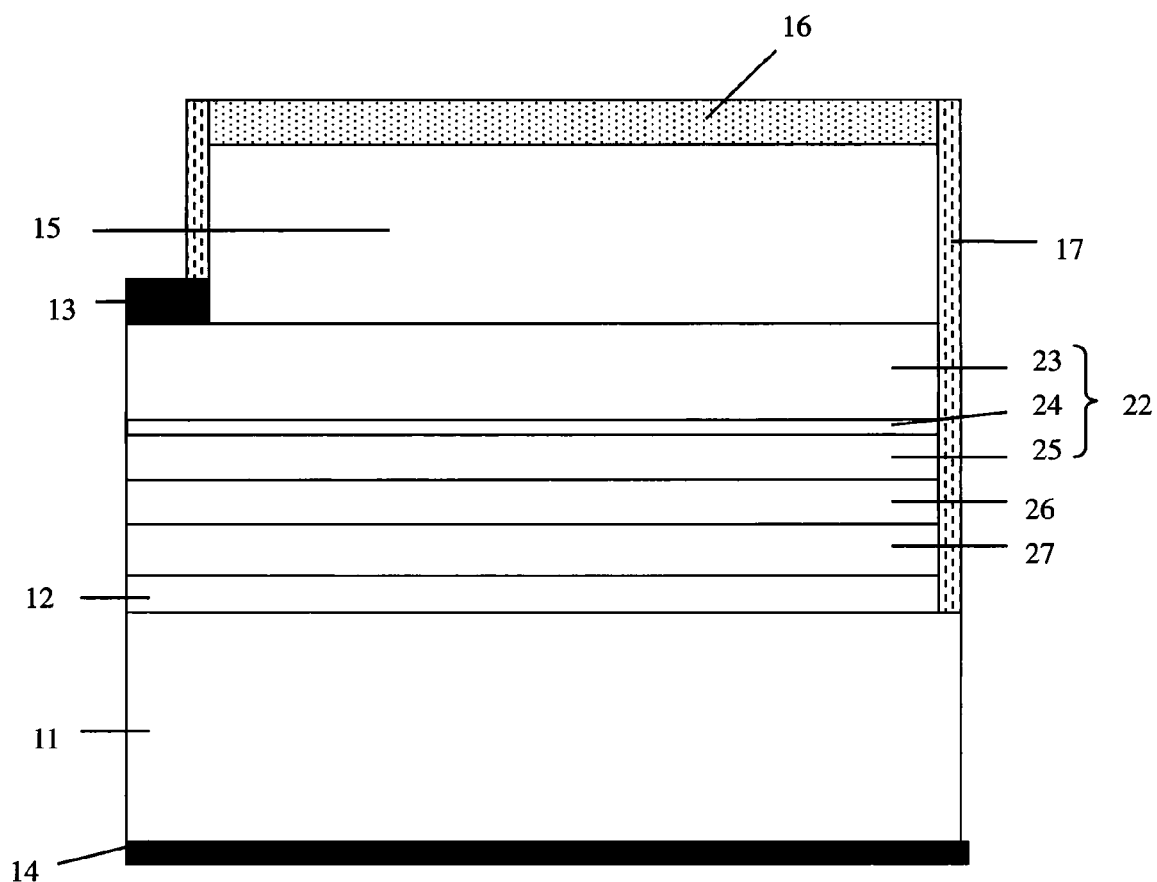

FIG. 8A illustrates a top view of forming a semiconductor luminescence device 400. FIG. 8B illustrates a cross-sectional view from the direction pointed by an arrow a and cut along the a'a' dotted line. FIG. 8C illustrates a cross-sectional view from the direction pointed by an arrow b and cut along the b'b' dotted line. The preceding manufacturing processes are the same as that of the above embodiment shown in FIG. 1 to FIG. 3. When the growth substrate 21 is removed (not shown in the figure), a portion of the first conductivity type semiconductor layer 23, the active layer 24, the second conductivity type semiconductor layer 25, the second conductivity type contact layer 26, the reflective layer 27, and the connecting layer 12 are etched away to expose the upper surface of the electrically conductive substrate 11. The electrodes 13 and 14 are formed respectively on the first conductivity type semiconductor layer 23 and under the electrically conductive substrate 11. A transparent paste layer 15 with a thickness no less than 0.3 mm covers the first conductivity type semiconductor layer 23 except the portion of the upper electrode. The material of the transparent paste layer can be epoxy, and the coating area of the transparent paste layer is not greater than that of the epitaxial structure. A reflective wall 17 is formed on the sidewall of the transparent paste layer, and a wavelength conversion structure 16 covers the whole upper surface of the transparent paste layer wherein the wavelength conversion structure 16 contains at least one kind of wavelength conversion material. To avoid the light loss from the light-emitting diode sideway, a reflective wall 17 is formed on the sidewalls of the transparent paste layer 15, the first conductivity type semiconductor layer 23, the active layer 24, the second conductivity type semiconductor layer 25, the second conductivity type contact layer 26, the reflective layer 27, and the connecting layer 12. The semiconductor luminescence device 400 shown in FIG. 8C is then formed accordingly. The epitaxial structure 22 can emit a first light when the current is injected. The light extraction efficiency is not decreased much after the first light passes through the transparent paste layer 15 because the optical transmission of the transparent paste layer is close to 99-100% and the light from the sidewall is reflected by the reflective wall 17. The first light entering the wavelength conversion structure 16 can be absorbed by the wavelength conversion material in the wavelength conversion structure and generate a second light having a wavelength different from that of the first light. Because the wavelength conversion material is not limited to one kind, the second light can be many colors.

Figure 9:
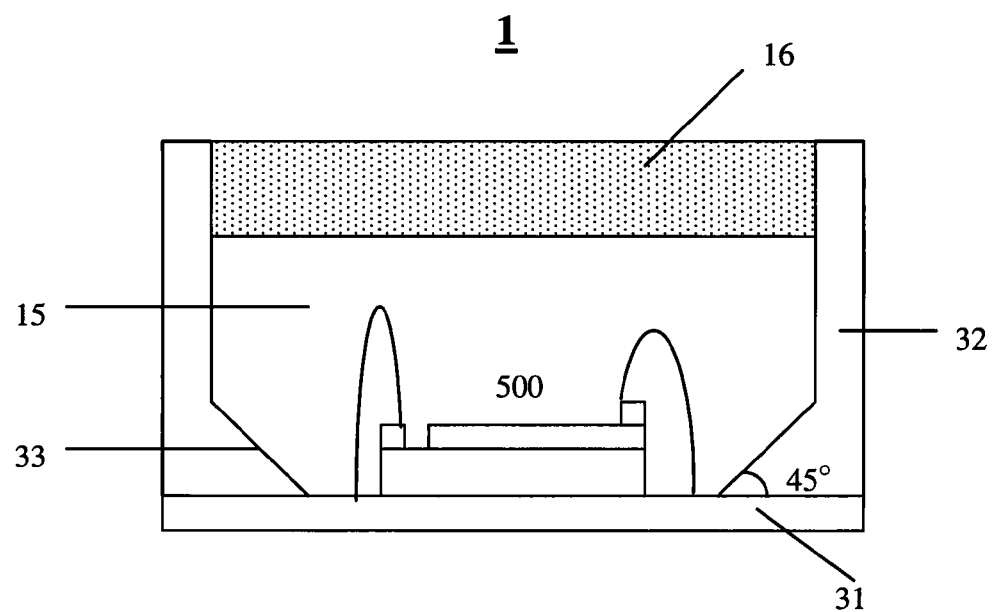
FIG. 9 illustrates a sectional view of forming a semiconductor luminescence device package structure 1 in accordance with one embodiment of the present application.

The same design concept can be applied to the semiconductor luminescence device package structure I as shown in FIG. 9. A semiconductor luminescence device 500 is fixed on the lead frame 31 and is electrically connected to the circuit of the lead frame by an electrical connector. A cup 32 with a reflective wall 33 is on the lead frame, and the angle between at least a portion of the reflective wall and the lead frame is about 45 degree. The cup 32 is filled with the transparent paste layer 15, and the height of the transparent paste layer is at least greater than that of the semiconductor luminescence device 500. The transparent paste layer can be epoxy, and the coating area of the transparent paste layer is not greater than that of the epitaxial structure. A wavelength conversion structure 16 is formed on the transparent paste layer, and the semiconductor luminescence device package structure 1 is formed. The light extraction efficiency is not decreased much after the first light passes through the transparent paste layer 15 because the optical transmission of the transparent paste layer is close to 99-100%. The first light entering the wavelength conversion structure 16 can be absorbed by the wavelength conversion material in the wavelength conversion structure, and generate a second light having a wavelength different from that of the first light. Because the wavelength conversion material is not limited to one kind, the second light can be many colors.

Figure 10:
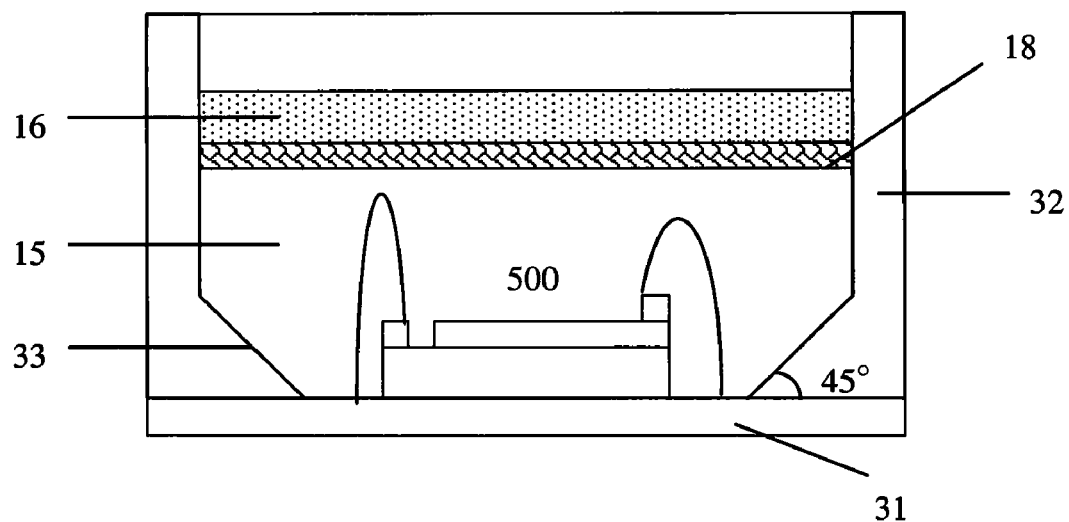
FIG. 10 illustrates a sectional view of forming a semiconductor luminescence device package structure 2 in accordance with another embodiment of the present application.

FIG. 10 illustrates a cross-sectional view of forming a semiconductor luminescence device package structure 2. Most of the manufacturing processes are similar to the semiconductor luminescence device package structure 1, but a wavelength selection film 18 is further formed between the transparent paste layer 15 and the wavelength conversion structure 16. The wavelength selection film allows the visible light pass through to head to the wavelength conversion structure and bans the visible light that is reflected by the wavelength conversion structure.

Figure 11:
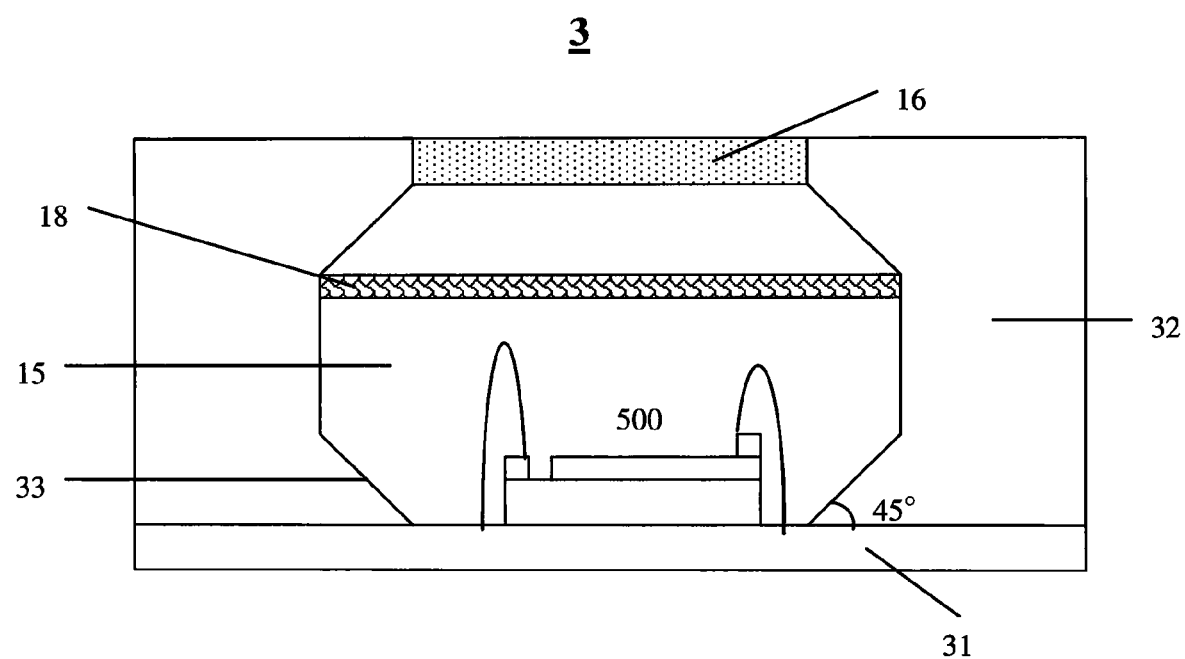
FIG. 11 illustrates a sectional view of forming a semiconductor luminescence device package structure 3 in accordance with another embodiment of the present application.

The design of the reflective wall 33 on the sidewall of the cup is shown in FIG. 11 and has improved reflective effect than that of the device shown in the FIG. 10.

Other embodiments of the application will be apparent to those having ordinary skills in the art from consideration of the specification and practice of the invention disclosed herein. It is intended that the specification and examples be considered as exemplary only, with a true scope and spirit of the invention being indicated by the following claims.

I claim:

1. A light-emitting semiconductor device, comprising:
   an electrically conductive substrate;
   a semiconductor luminescence stack layer on the electrically conductive substrate;
   a reflective layer between the electrically conductive substrate and the semiconductor luminescence stack layer;
   a transparent paste layer on the semiconductor luminescence stack layer, wherein the thickness of the transparent paste layer is at least 0.3 mm;
   a reflective wall on the sidewall of the transparent paste layer; and
   a wavelength conversion structure on the transparent paste layer, wherein the wavelength conversion structure including at least one wavelength conversion material.

2. The light-emitting semiconductor device according to claim 1, wherein the material of the transparent paste layer is epoxy.

3. The light-emitting semiconductor device according to claim 1, wherein the coating area of the transparent paste layer is not greater than that of the semiconductor luminescence stack layer.

4. The light-emitting semiconductor device according to claim 1, wherein the wavelength conversion structure comprising one kind of material selected from the group consisting of $Y_3Al_5O_{12}$, $Gd_3Ga_5O_{12}$:Ce, $(Lu,Y)_3Al_5O_{12}$:Ce, SrS:Eu, $SrGa_2S_4$:Eu, $(Sr,Ca,Ba)(Al,Ga)_2S_4$:Eu, $(Ca,Sr)S$:Eu,Mn, $(Ca,Sr)S$:Ce, $(Sr,Ba,Ca)_2Si_5N_8$:Eu, $(Ba,Sr,Ca)_2SiO_4$:Eu, $(Ca,Sr,Ba)Si_2O_2N_2$:Eu, and CdZnSe.

5. The light-emitting semiconductor device according to claim 1, wherein the reflective wall on the sidewall of the transparent paste layer and the reflective layer comprising one kind of material selected from the group consisting of metal, oxide and other reflective materials.

6. The light-emitting semiconductor device according to claim 5, wherein the reflective wall on the sidewall of the transparent paste layer and the reflective layer comprising one kind of material selected from the group consisting of In, Sn, Al, Au, Pt, Zn, Ag, Ti, Pb, Ge, Cu, Ni, AuBe, AuGe, AuZn, PbSn, $SiN_x$, $SiO_2$, $Al_2O_3$, $TiO_2$, and MgO.

7. A semiconductor luminescence device, comprising:
an electrically conductive substrate;
a semiconductor luminescence stack layer on the electrically conductive substrate;
a reflective layer between the electrically conductive substrate and the semiconductor luminescence stack layer;
a transparent paste layer on the semiconductor luminescence stack layer, wherein the thickness of the transparent paste layer is at least 0.3 mm;
a reflective wall on the sidewall of the transparent paste layer; and
a wavelength conversion structure distributed uniformly in the transparent paste layer.

8. The semiconductor luminescence device according to claim 7, wherein the material of the transparent paste layer is epoxy.

9. The semiconductor luminescence device according to claim 7, wherein the coating area of the transparent paste layer is not greater than that of the semiconductor luminescence stack layer.

10. The semiconductor luminescence device according to claim 7, wherein the wavelength conversion structure comprising one kind of material selected from the group consisting of $Y_3Al_5O_{12}$, $Gd_3Ga_5O_{12}$:Ce, $(Lu,Y)_3Al_5O_{12}$:Ce, SrS:Eu, $SrGa_2S_4$:Eu, $(Sr,Ca,Ba)(Al,Ga)_2S_4$:Eu, (Ca,Sr)S:Eu,Mn, (Ca,Sr)S:Ce, $(Sr,Ba,Ca)_2Si_5N_8$:Eu, $(Ba,Sr,Ca)_2SiO_4$:Eu, $(Ca,Sr,Ba)Si_2O_2N_2$:Eu, and CdZnSe.

11. The semiconductor luminescence device according to claim 7, wherein the reflective wall on the sidewall of the transparent paste layer and the reflective layer comprising one kind of material selected from of the group consisting of metal, oxide and other reflective materials.

12. The semiconductor luminescence device according to claim 11, wherein the reflective wall on the sidewall of the transparent paste layer and the reflective layer comprising one kind of material selected from the group consisting of In, Sn, Al, Au, Pt, Zn, Ag, Ti, Pb, Ge, Cu, Ni, AuBe, AuGe, AuZn, PbSn, $SiN_x$, $SiO_2$, $Al_2O_3$, $TiO_2$, and MgO.

13. A semiconductor luminescence device, comprising:
an electrically conductive substrate;
a semiconductor luminescence stack layer on the electrically conductive substrate;
a reflective layer between the electrically conductive substrate and the semiconductor luminescence stack layer;
a transparent paste layer on the semiconductor luminescence stack layer, wherein the thickness of the transparent paste layer is at least 0.3 mm;
a reflective wall on the sidewall of the transparent paste layer; and
a wavelength conversion structure in the transparent paste layer, wherein the wavelength conversion structure including at least one wavelength conversion material.

14. The semiconductor luminescence device according to claim 13, wherein the material of the transparent paste layer is epoxy.

15. The semiconductor luminescence device according to claim 13, wherein the coating area of the transparent paste layer is not greater than that of the semiconductor luminescence stack layer.

16. The semiconductor luminescence device according to claim 13, wherein the wavelength conversion structure comprising one kind of material selected from the group consisting of $Y_3Al_5O_{12}$, $Gd_3Ga_5O_{12}$:Ce, $(Lu,Y)_3Al_5O_{12}$:Ce, SrS:Eu, $SrGa_2S_4$:Eu, $(Sr,Ca,Ba)(Al,Ga)_2S_4$:Eu, (Ca,Sr)S:Eu,Mn, (Ca,Sr)S:Ce, $(Sr,Ba,Ca)_2Si_5N_8$:Eu, $(Ba,Sr,Ca)_2SiO_4$:Eu, $(Ca,Sr,Ba)Si_2O_2N_2$:Eu, and CdZnSe.

17. The semiconductor luminescence device according to claim 13, wherein the reflective wall on the sidewall of the transparent paste layer and the reflective layer comprising one kind of material selected from the group consisting of metal, oxide and other reflective materials.

18. The semiconductor luminescence device according to claim 17, wherein the reflective wall on the sidewall of the transparent paste layer and the reflective layer comprising one kind of material selected from the group consisting of In, Sn, Al, Au, Pt, Zn, Ag, Ti, Pb, Ge, Cu, Ni, AuBe, AuGe, AuZn, PbSn, $SiN_x$, $SiO_2$, $Al_2O_3$, $TiO_2$, and MgO.

19. A semiconductor luminescence device package structure, comprising:
a lead frame;
a cup on the lead frame;
a reflective wall in the cup, wherein the angle between at least a portion of the reflective sidewall and the lead frame is about 30 to 60 degree;
a luminescence device fixed in the cup;
a transparent paste layer filled in the cup, wherein the height of the transparent paste layer is greater than that of the luminescence device; and
a wavelength conversion structure on the transparent paste layer.

20. The semiconductor luminescence device package structure according to claim 19, further including a wavelength selection film between the transparent paste layer and the wavelength conversion structure.

* * * * *